(12) United States Patent
Sato et al.

(10) Patent No.: US 10,599,197 B2
(45) Date of Patent: Mar. 24, 2020

(54) CONFIGURATION OF DEFAULT VOLTAGE LEVEL FOR DUAL-VOLTAGE INPUT/OUTPUT PAD CELL VIA VOLTAGE RAIL RAMP UP TIMING

(71) Applicant: Freescale Semiconductor, Inc., Austin, TX (US)

(72) Inventors: Haku Sato, Austin, TX (US); Robert Greenwood, Austin, TX (US); Paul M. Herbst, Austin, TX (US)

(73) Assignee: NXP USA, INC., Austin, TX (US)

( * ) Notice: Subject to any disclaimer, the term of this patent is extended or adjusted under 35 U.S.C. 154(b) by 205 days.

(21) Appl. No.: 15/269,475

(22) Filed: Sep. 19, 2016

(65) Prior Publication Data

US 2018/0081412 A1   Mar. 22, 2018

(51) Int. Cl.
| | | |
|---|---|---|
| G06F 1/26 | (2006.01) | |
| G06F 1/28 | (2006.01) | |
| G06F 9/4401 | (2018.01) | |
| G11C 5/14 | (2006.01) | |
| G11C 7/20 | (2006.01) | |
| G11C 16/20 | (2006.01) | |
| G11C 16/30 | (2006.01) | |

(52) U.S. Cl.
CPC .............. *G06F 1/266* (2013.01); *G06F 1/26* (2013.01); *G06F 1/263* (2013.01); *G06F 1/28* (2013.01); *G06F 9/4406* (2013.01); *G11C 5/148* (2013.01); *G11C 7/20* (2013.01); *G11C 16/20* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 5,896,549 A * | 4/1999 | Hansen | G06F 13/28 710/22 |
| 5,910,690 A * | 6/1999 | Dorsey | G06F 13/4081 307/141 |
| 6,323,701 B1 | 11/2001 | Gradinariu et al. | |
| 6,323,704 B1 | 11/2001 | Pelley et al. | |
| 6,549,032 B1 * | 4/2003 | Shumarayev | G06F 1/24 326/33 |
| 7,362,136 B2 | 4/2008 | Chen | |
| 8,997,032 B2 | 3/2015 | Chen et al. | |
| 2005/0264329 A1 | 12/2005 | Ott | |
| 2006/0214009 A1 | 9/2006 | Shikata et al. | |
| 2007/0080726 A1 * | 4/2007 | Khan | G06F 1/24 327/143 |
| 2008/0238488 A1 * | 10/2008 | Comisky | G01R 31/40 327/20 |

(Continued)

*Primary Examiner* — Paul Yen

(57) ABSTRACT

An integrated circuit (IC) package of an electronic device includes a first input coupled to a first voltage rail and a second input coupled to a second voltage rail. The IC package further includes a set of one or more input/output (IO) pad cells and a power sequence detector coupled to the first and second voltage rails. The power sequence detector monitors the first and second voltage rails and configures the set of one or more IO pad cells to operate at one of a non-zero first voltage level or a non-zero second voltage level depending on which of the first voltage rail and the second voltage rail ramps up to a corresponding specified voltage level first.

18 Claims, 5 Drawing Sheets

(56) References Cited

U.S. PATENT DOCUMENTS

2013/0346761 A1* 12/2013 Hu ............................ G06F 1/30
   713/300
2014/0115313 A1*  4/2014 Chen ....................... G06F 1/266
   713/2
2015/0362970 A1* 12/2015 Aggarwal ................. G06F 1/28
   713/300

* cited by examiner

CONFIGURATION OF DEFAULT VOLTAGE LEVEL FOR DUAL-VOLTAGE INPUT/OUTPUT PAD CELL VIA VOLTAGE RAIL RAMP UP TIMING

BACKGROUND

Typical conventional integrated circuit (IC) package designs utilize a fixed or defined default voltage level for the input/output (IO) pads of the design. However, to facilitate wider adoption in various electronic devices with different voltage levels for signaling conducted with IO pads of an IC package, some IC package designs may utilize IO pad cells that can be configured to operate at one of two voltages, with such IO pad cells typically referred to as "dual-voltage IO pad cells." The dual-voltage IO pad cells can be configured to operate at a particular default voltage level during boot up of the IC package so as to facilitate communication with a corresponding device component that likewise operates its external signaling at the same voltage level. However, in conventional IC package designs, the configuration of the default voltage level of the 10 pad cells is performed by software during the boot process via configuration settings stored in a read only memory (ROM) or as the reset values of one or more associated configuration registers. As a result, reconfiguration of the default voltage level for the dual IO pad cells in a conventional IC package typically would require modification of the ROM or configuration registers, which generally is cost-ineffective or otherwise impracticable.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

An electronic device or other apparatus implements an integrated circuit (IC) package having one or more IO pad cells that are configurable to operate any one of a plurality of voltage levels. In at least one embodiment, the IO pad cells are initially configured to operate at a default voltage level following a power cycling of the IC package, and then may be subsequently reconfigured to another voltage level through software-based reconfiguration. As described in greater detail herein, the IO pad cells are configured to the default voltage level through timing of the ramp up of the voltage rails that respectively provide the plurality of voltage rails. In this approach, the default voltage level of the IO pad cells is set to the voltage level of the voltage rail that is the first one to ramp up to its corresponding voltage level. In this manner, the electronic device can configure the default voltage levels for IO pad cells of the IC package via configuration of the ramp up timing of the power supplies for the voltage rails. As the power supplies are external to the IC package, the control of their ramp up timing also may be performed external to the IC package, and thus effectively permitting external control of the configuration of the default voltage level for the IO pad cells, thereby avoiding the difficulties of reconfiguring the default voltage level for IO pad cells in conventional IC packages that rely on ROM settings or reset values of one or more configuration registers for setting the default voltage level.

Figure 1:
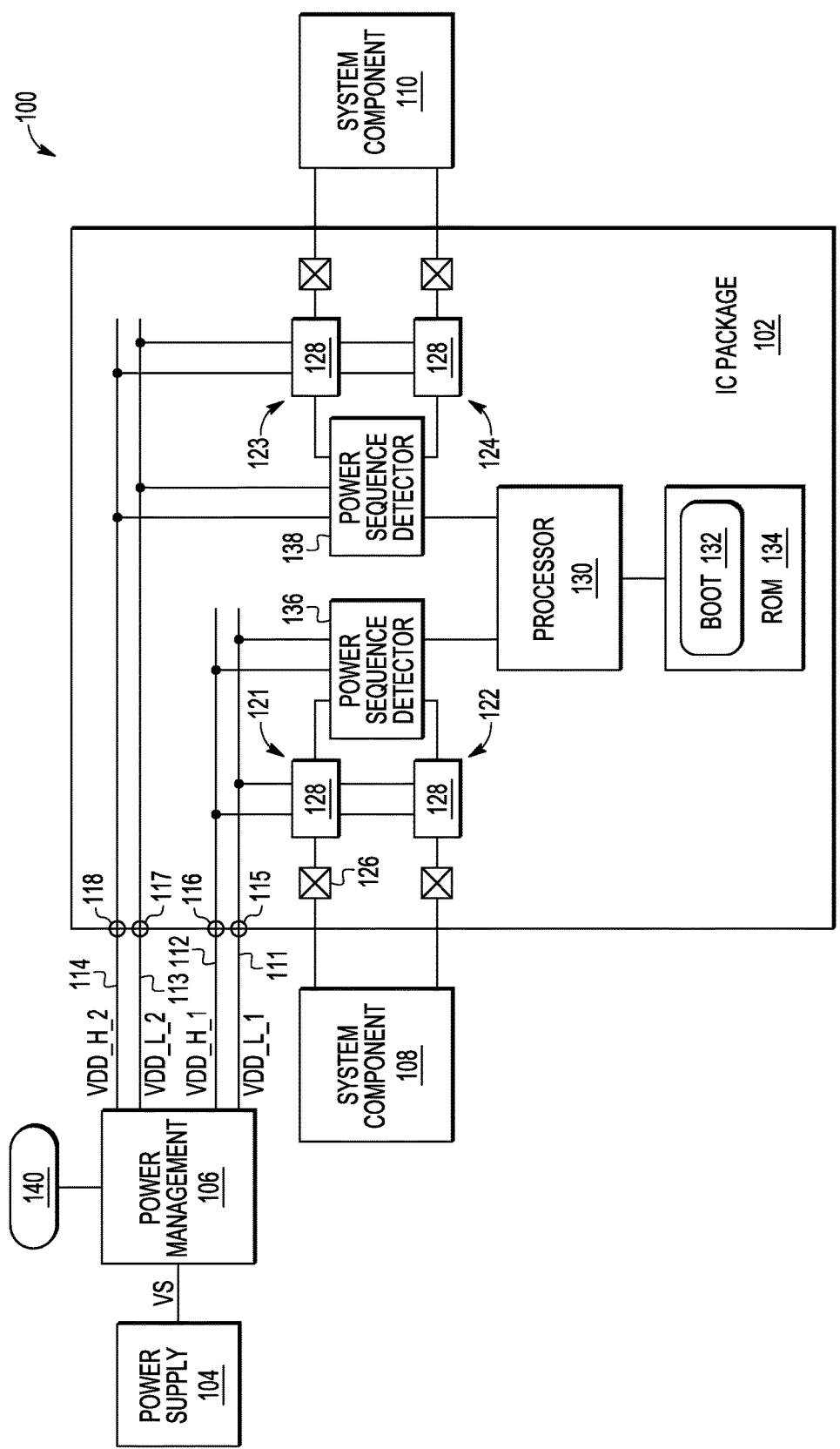
FIG. 1 is a block diagram of an electronic device employing an IC package with dual-voltage IO pad cells having default voltage levels configurable through voltage rail ramp up timing in accordance with some embodiments.

FIG. 1 illustrates a portion of an example electronic device 100 in accordance with at least one embodiment of the present disclosure. The electronic device 100 represents, for example, a user electronic device (e.g., a personal computer, a tablet computer, a compute-enabled cellular phone), a control system for an automobile or other vehicle, an industrial electronic system, and the like. As depicted, the electronic device 100 includes an IC package 102, a power supply 104, a power management component 106, and one or more system components, such as system component 108, 110. The system components 108, 110 comprise, for example, sensors, audio codecs, secure digital (SD) card readers, and the like.

The power supply 104 operates to supply a supply voltage VS to the power management component 106. The power management component 106 in turn utilizes the supply voltage VS to power a plurality of voltage rails that are electrically coupled to the IC package 102, such as voltage rails 111, 112, 113, and 114. For this example, the voltage rails 111, 112 serve as the low and high voltage rails, respectively, for one voltage domain, whereas the voltage rails 113, 114 serve as the low and high voltage rails, respectively, for another voltage domain.

The IC package 102 includes inputs (e.g., power pads, not shown) to couple the IC package 102 to some or all of the voltage rails, such as inputs 115, 116, 117, 118 to couple to the voltage rails 111, 112, 113, 114, respectively. The IC package 102 further includes a plurality of IO pad cells that are configurable to operate at two or more of the voltage levels provided by the voltage rails coupled to the IC package 102. To illustrate, in the example of FIG. 1, the IC package 102 includes IO pad cells 121, 122 coupled to the system component 108 and configurable to operate at either a non-zero voltage level VDD_L_1 provided by the voltage rail 111 or at a non-zero voltage level VDD_H_1 provided by the voltage rail 112, and further includes IO pad cells 123, 124 coupled to the system component 110 and configurable to operate at either a non-zero voltage level VDD_L_2 provided by the voltage rail 113 or at a non-zero voltage level VDD_H_2 provided by the voltage rail 114. Each of the IO pad cells 121, 122, 123, 124 includes a pad 126 for providing an electrical connection to a corresponding system component external to the IC package 102 via a trace, wire, or other conductive interconnect, as well as driver/receiver circuitry 128 to drive outgoing signals when the IO pad cell is configured to operate as an output and to receive incoming signals when the IO pad cell is configured to operate as an input. Note that in some implementations, the IO pad cells 121, 122, 123, 124 are general purpose IO (GPIO) pad cells to facilitate connection of the IC package 102 to a wide variety of external system components. An example implementation of the IO pad cell is illustrated in greater detail below with reference to FIG. 4.

In operation, following a power on reset (POR), cold boot, or other power cycling of the IC package 102, a processor 130 of the IC package 102 accesses boot code 132 from a read only memory (ROM) 134 and initiates a boot process to configure the IC package 102 for operation in conjunction with the other components of the electronic device 100. Although the ROM 134 is illustrated as a ROM internal to the IC package 102, in other embodiments the ROM 134 may be implemented as a ROM external to the IC package 102. During the boot process, the IC package 102 may need to communicate various signaling with the system components 108, 110 via the IO pad cells 121, 122, 123, 124. However, as each of these IO pad cells is configurable to operate at different voltage levels to provide the IC package 102 the flexibility to be implemented in a variety of systems, the IO pad cells must be set to operate at a default voltage level after the power cycling until they can be reconfigured at a later point, such as later in the boot processor or after the boot process has completed. As noted above, in a conventional IC package having dual-voltage IO pad cells, this default configuration is performed via ROM settings or via the reset values of one or more corresponding control registers, and thus the default voltage setting for the dual-voltage IO pad cells cannot be readily changed. Thus, if the default voltage level set for an IO pad cell is not compatible with the signaling level of the system component connected to the pad 126 of that pad cell, it is likely that the system component and the IC package will be unable to successfully transmit and receive signaling via the IO pad cell while set at this default voltage level. This in turn can delay completion of the boot process or even prevent the IC package 102 from reaching an operational state.

To avoid this problem and allow the dual-voltage IO pad cells 121, 122, 123, 124 of the IC package 102 to be configured to a default voltage level compatible with the signaling expected to be received during the initial operation of the IC package 102, in at least one embodiment the power management component 106 controls the ramp up timing for the voltage rails 111, 112, 113, 114 to signal the desired default voltage levels for the IO pad cell sets, and the IC package 102 uses this relative timing of the voltage ramp-ups of the voltage rails 111, 112, 113, 114 to configure the corresponding default voltage for the corresponding IO pad cells 121, 122, 123, 124. In particular, the IC package 102 monitors the voltages on the voltage rails 111, 112, 113, 114, and the first voltage rail within a voltage domain to reach its specified operational voltage level triggers the IC package 102 to set the IO cell pads within that voltage domain to operate at that operational voltage level by default.

To this end, each voltage domain includes a power sequence detector to monitor the voltage rails for the voltage domain, and to set the default voltage levels for the IO pad cells within that voltage domain accordingly. Thus, the voltage domain represented by voltage rails 111, 112 includes a power sequence detector 136 to monitor the voltage rails 111, 112 and set the IO pad cells 121, 122 according to the respective ramp up timing on these voltage rails, while the voltage domain represented by the voltage rails 113, 114 includes a power sequence detector 138 to operate in a similar manner with respect to the IO pad cells 123, 124. An example implementation of the power sequence detectors 136, 138 is described in greater detail below with reference to FIGS. 4 and 5.

By utilizing the ramp up timing of the voltage rails within a given voltage domain to set or otherwise configure the default voltage level for the IO pad cells within that voltage domain, control of the default voltage level for the IO pad cells is vested in the components of the electronic device 100 that are external to the IC package 102, and thus permitting a change in the default voltage level for the IO pad cells of the IC package 102 to occur through adjustment of the relative ramp-up timing of the voltage rails via components external to the IC package 102. Thus, as changing the default voltage level used by the IO pad cells does not require a change of ROM settings, configuration register settings, or other pre-configuration of the IC package 102, the electronic device 100 can provide for default voltage levels for the IO pad cells that are best suited for the system components that interface with those IO pad cells.

Figure 2:
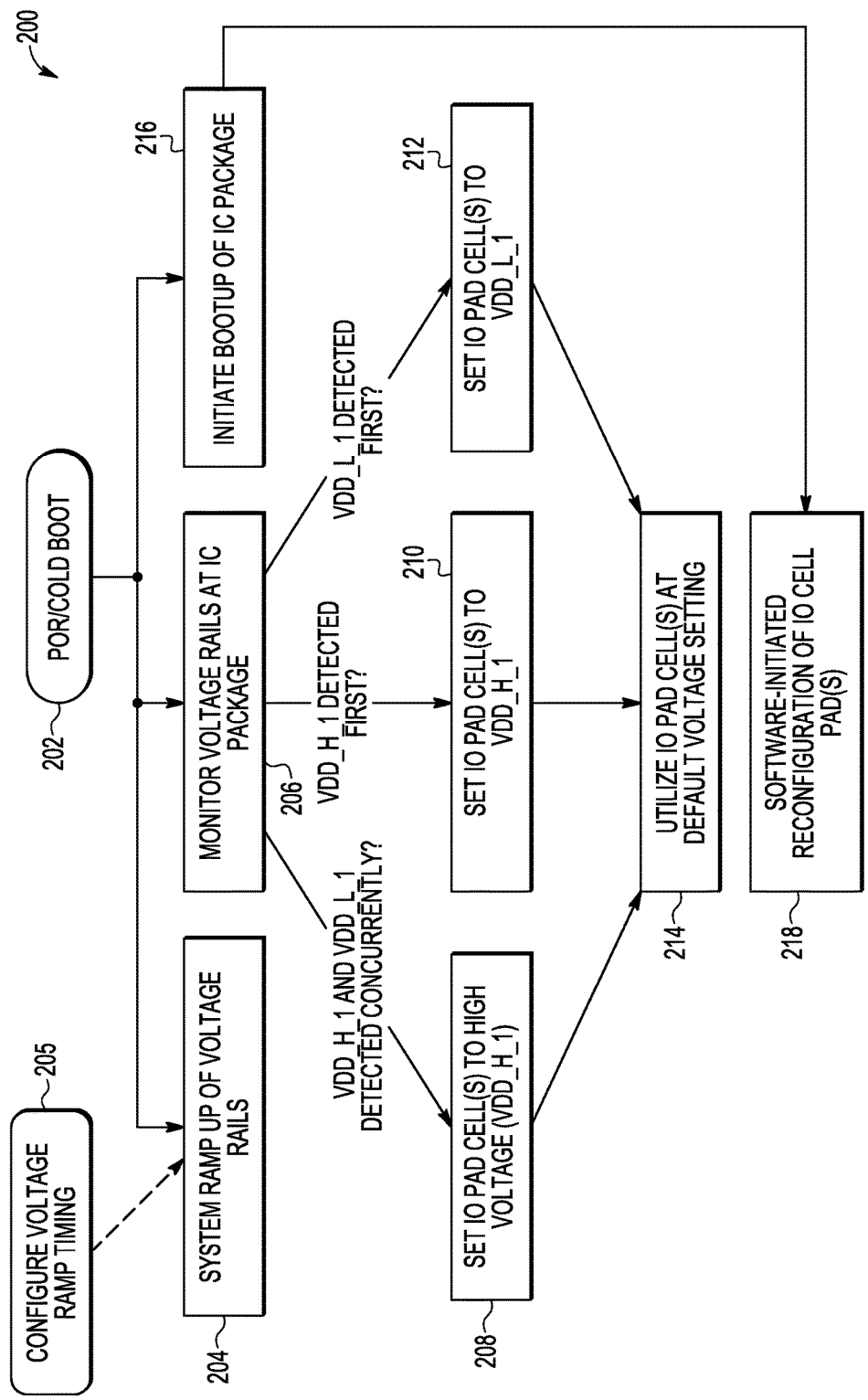
FIG. 2 is a flow diagram of a method for configuring a default voltage level of dual-voltage IO pad cells of the IC package of FIG. 1 via voltage rail ramp up timing in accordance with some embodiments.

FIG. 2 illustrates an example method 200 for configuration of the default voltage level for IO pad cells 121, 122 of the IC package 102 for the voltage domain represented by voltage rails 111, 112 in accordance with some embodiments. A similar process applies for the programming of the default voltage level of the IO pad cells 123, 124 for the voltage domain represented by voltage rails 113, 114. At block 202 the IC package 102 is subjected to power cycling in the form of a POR or cold boot. In response to the power cycling, at block 204 the power management component 106 begins the ramp up of the voltage rails 111, 112 toward their respective specified operational voltage levels, namely, VDD_L_1 and VDD_H_1, respectively. As represented by block 205, at an earlier point, the power management component 106 is programmed or otherwise configured with ramp up timing settings (stored in, and accessed from, storage element 140 of FIG. 1) that control the timing of the ramp up of the various voltage rails such that the voltage rail that ultimately provides the voltage level that is intended to be the default voltage level for the IO pad cells for a voltage domain is the first voltage rail to ramp up to its specified operational voltage level.

Concurrent with the voltage rail ramp up process of block 204, at block 206 the power sequence detector 136 begins monitoring the voltage rails 111, 112 to determine which voltage rail reaches its corresponding operational voltage level first. If the voltage rail 111 reaches the voltage level VDD_L_1 at the same time (or within a margin of error) that the voltage rail 112 reaches the voltage level VDD_H_1, then at block 208 the power sequence detector 136 sets the default voltage level of the IO pad cells 121, 122 to the higher voltage level of the two voltage levels, which is VDD_H_1 in this example. Otherwise, if the voltage level VDD_H_1 is detected on voltage rail 112 before the voltage rail VDD_L_1 is detected on voltage rail 111 (that is, voltage rail 112 ramps up before voltage rail 111 ramps up), at block 210 the power sequence detector 136 sets the default voltage level of the IO pad cells 121, 122 to the voltage level VDD_H_1. Conversely, if the voltage level VDD_L_1 is detected on voltage rail 111 before the voltage level VDD_H_1 is detected on voltage rail 112, then at block 212 the power sequence detector 136 sets the default voltage level of the IO pad cells 121, 122 to the voltage level VDD_L_1.

With the default voltage level set for the IO pad cells 121, 122 based on the voltage rail ramp up timing described above, at block 214 the IO pad cells 121, 122 may be used to communicate signaling with the system component 108. In some embodiments, this default configuration may be temporary following the power cycling, and the IO pad cells 121, 122 may be reconfigured to operate at a different voltage level at a later point in time following the power cycling. To illustrate, returning to block 202, following the power cycling and after the voltage rails have ramped up to their specified operating voltages, at block 216 the processor 130 accesses the boot code 132 from the ROM 134 and executes the boot code 132 to initiate a boot process for the IC package 102. At some point during this boot process, the boot code 132 may include a set of one or more instructions that manipulate the processor 130 to reconfigure the operational voltage level of the IO pad cells 121, 122 to a specific voltage level, which may differ from the default voltage level set earlier, via, for example, a programmable register as represented by block 218. Alternatively, a software program that is executed following completion of the boot process may have need to change the voltage level employed by the IO pad cells 121, 122, and thus block 218 also represents a situation in which this software application manipulates the processor 130 to reconfigure the voltage level of the IO pad cells 121, 122. Such operational voltage level changes may be implemented in response to a change in operating mode or operating speed of the IC package 102, or to comply with a particular IO communication protocol.

Figure 3:
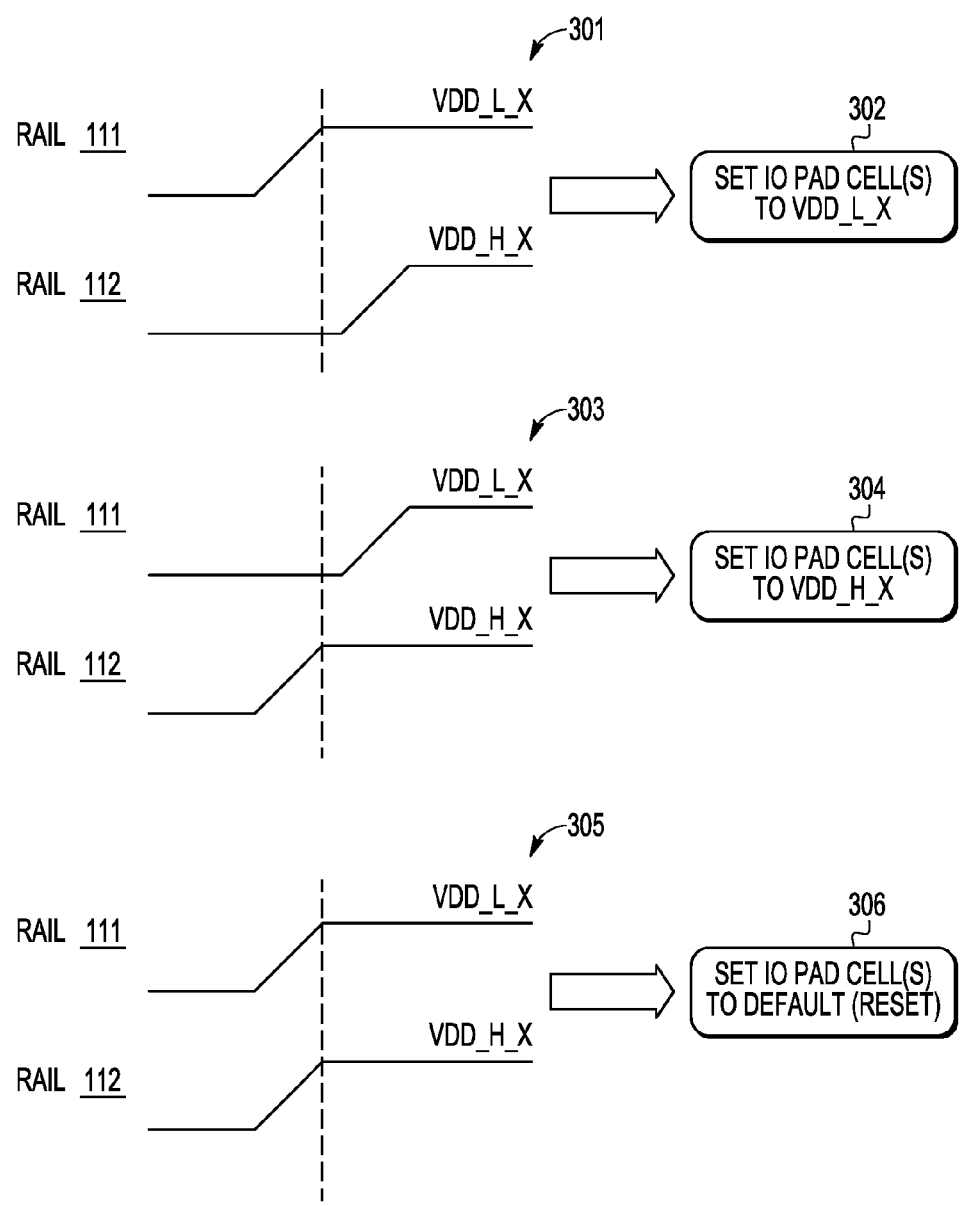
FIG. 3 is a diagram illustrating various voltage rail ramp up timing scenarios and their resulting effect on the configuration of the default voltage level of dual-voltage IO pad cells of the IC package of FIG. 1 in accordance with some embodiments.

FIG. 3 illustrates example voltage ramp up timings representative of the three relative timing scenarios contemplated by the method 200 of FIG. 2. Diagram 301 represents the voltage levels of the voltage rails 111, 112 in a scenario in which the voltage rail 111 ramps up to the specified operational voltage level VDD_L_1 at a time t0 before the voltage rail 112 ramps up to the specified operational voltage VDD_H_1. That is, the voltage rail 111 reaches its operational voltage level before the voltage rail 112. Accordingly, the power sequence detector 136 sets the default voltage level of the IO pad cells 121, 122 to the voltage level VDD_L_1, as represented by block 302.

Diagram 303 represents the voltage levels of the voltage rails 111, 112 in a scenario in which the voltage rail 112 ramps up to the specified operational voltage level VDD_H_1 at a time t0 before the voltage rail 111 ramps up to the specified operational voltage VDD_L_1. That is, the voltage rail 112 reaches its operational voltage level before the voltage rail 111. Accordingly, the power sequence detector 136 sets the default voltage level of the IO pad cells 121, 122 to the voltage level VDD_H_1, as represented by block 304.

Diagram 305 represents the voltage levels of the voltage rails 111, 112 in a scenario in which the voltage rail 112 ramps up to the specified operational voltage level VDD_H_1 at the same time t0 that the voltage rail 111 ramps up to the specified operational voltage VDD_L_1. That is, the voltage rails 111, 112 reach their operational voltage levels at the same time (within a margin of error). Accordingly, the power sequence detector 136 sets the default voltage level of the IO pad cells 121, 122 to the voltage level represented by a reset value of a configuration register (e.g., configuration register 402, FIG. 4) of the power sequence detector 136, as represented by block 306.

Figure 4:
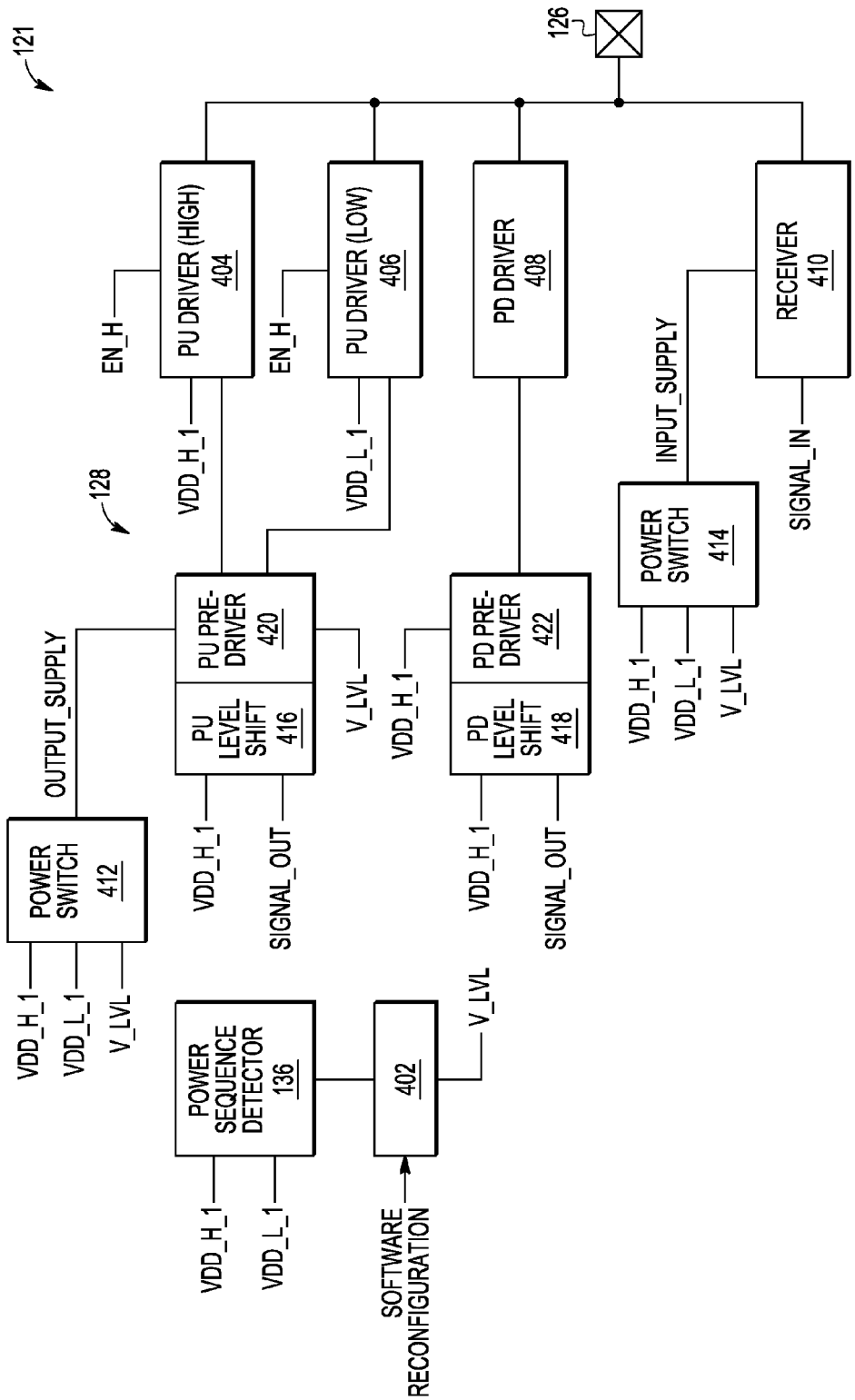
FIG. 4 is a block diagram illustrating an example implementation of a power sequence detector and a dual-voltage IO pad cell of an IC package in accordance with some embodiments.

FIG. 4 illustrates an example implementation of an IO pad cell 121 in conjunction with the power sequence detector 136. The IO pad cell 122 is similarly configured, and the IO pad cells 123, 124 are likewise configured with respect to the power sequence detector 138. As shown, the power sequence detector 136 includes inputs coupled to the voltage rails 111, 112 and an output to provide a value representative of the default voltage level to which the IO pad cell 121 is to be set. As there are two possible voltage levels, VDD_L_1 and VDD_H_1, in this example implementation, the value may be implemented as a binary value, with a 0 value indicating selection of the voltage level VDD_H_1 and a "1" value indicating selection of the voltage level VDD_L_1. As further shown, in at least one embodiment the IC package 102 employs a voltage level configuration register 402 that stores the values determined for each voltage domain of the IC package 102. Further, as explained above, the IO pad cells of a voltage domain may be subsequently reconfigured via software, and thus in at least one embodiment the voltage level configuration register 402 is accessible to the boot code 132 or other software. The current value stored at the configuration register 402, whether the reset value or the value provided by the power sequence detector 136, is referred to herein as the value V_LVL and represents the voltage level to be implemented for the IO pad cell 121.

As explained above, the IO pad cell 121 includes a pad 126 and driver/receiver circuitry 128 coupled to the pad 126. In the example implementation of FIG. 4, the driver/receiver circuitry 128 includes a pull-up (PU) driver 404 for the higher voltage level (VDD_H_1), a PU driver 406 for the lower voltage level (VDD_L_1), a pull-down (PD) driver 408, each of which has an output coupled to the pad 126, as well as a receiver 410 having an input coupled to the pad 126. The driver/receiver circuitry 128 further includes power switches 412, 414, PU level shifter 416, PD level shifter 418, PU pre-driver 420, and PD pre-driver 422.

The power switch 412 includes inputs to receive the voltage levels VDD_L_1, VDD_H_1 from the voltage rails 111, 112, respectively, an input to receive the value V_LVL, and an output to provide a select one of the two input voltages as an output voltage labeled "OUTPUT_SUPPLY" based on whether the value V_LVL is a "0" or a "1". The PU level shifter 416 includes an input to receive an outgoing signal, labeled "SIGNAL_OUT", when the IO pad cell 121 is configured as an output pad and an input to receive the voltage level VDD_H_1. The PU level shifter 416 shifts the voltage level of the outgoing signal SIGNAL_OUT to the voltage level VDD_H_1.

The output of the PU level shifter 416 is connected to an input of the PU pre-driver 420, which also includes a power input that is coupled to the output of the power switch 412 to receive the output voltage level OUTPUT_SUPPLY and an input to receive the value V_LVL. The PU pre-driver 420 operates to control signals for both the PU driver 404 and the PU driver 406 based on the voltage levels represented by V_LVL and OUTPUT_SUPPLY. The PU driver 404 includes an input to receive the voltage level VDD_H_1 from the voltage rail 112, an input to receive the pre-driven output signal, and an input to receive a control signal EN_H that is asserted when the IO pad cell 121 is configured to operate using the higher voltage level VDD_H_1 (that is, when V_LVL is "1"). When the control signal EN_H is asserted, the PU driver 404 is activated and pulls up the voltage of the pad 126 toward the voltage level VDD_H_1 responsive to the pre-driven output signal being at a logic "high" or "1". Otherwise, when the control signal EN_H is unasserted, the PU driver 404 is placed in a high-impedance state. The PU driver 406 is similarly configured and has an input to receive to receive the voltage level VDD_L_1 from the voltage rail 111, an input to receive the pre-driven output signal, and an input to receive a control signal EN_H. When the control signal EN_H is unasserted, the PU driver 406 is activated and pulls up the voltage of the pad 126 toward the voltage level VDD_L_1 responsive to the pre-driven output signal being at a logic "high" or "1". Otherwise, when the control signal EN_H is asserted, the PU driver 406 is placed in a high-impedance state.

The PD level shifter 418 includes an input to receive the outgoing signal SIGNAL_OUT, when the IO pad cell 121 is configured as an output pad, an input to receive the voltage level VDD_H_1, and an input to receive a control signal LVL EN, which is asserted when the IO pad cell 121 is configured to operate under the higher voltage level VDD_H_1. Thus, when LVL EN is enabled, the PD level shifter 418 shifts the voltage level of the outgoing signal SIGNAL_OUT to the voltage level VDD_H_1. Otherwise, if the LVL EN signal is unasserted, the outgoing signal SIGNAL_OUT is passed without level shifting. The output of the PD level shifter 418 is connected to an input of the PD pre-driver 422, which also includes a power input that is coupled to the rail 112 to receive the voltage level VDD_H_1. The PD pre-driver 422 operates to pre-drive the outgoing signal at the voltage VDD_H_1. The pre-driven output signal output by the PD pre-driver 422 is provided to the PD driver 408, which operates to pull down the pad 126 toward VSS or ground responsive to the input pre-driven outgoing signal being at logic "high" or logic "1".

On the receive side, the power switch 414 operates in the same manner as the power switch 412 to provide an output voltage level, labeled "INPUT_SUPPLY" that is selected from either VDD_L_1 or VDD_H_1 depending on whether the value V_LVL is a "0" or a "1". The receiver 410 includes an input coupled to the pad 126 to receive an incoming signal from the pad 126, an input to receive the voltage level INPUT_SUPPLY from the power switch 414, and an output to provide an incoming signal labeled "SIGNAL_IN", where the receiver 410 operates to drive the incoming signal SIGNAL_IN from the incoming signal received at the pad 126 based on the voltage level INPUT_SUPPLY.

Thus, as the implementation of FIG. 4 illustrates, the power sequence detector 136 sets the value of V_LVL based on the ramp up timings of the voltage rails 111, 112, and the value of V_LVL in turn controls whether an outgoing signal or incoming signal is driven at either the voltage level VDD_L_1 or the voltage level VDD_H_1 depending on the value of V_LVL. This default voltage level thus is set based on the timings of the ramp ups of the voltage rails 111, 112 without configuration via ROM settings or other permanent settings or configurations of the IC package 102, and thus allowing the external components of the electronic device 100 to set the default voltage level for the IO pad cell 121 to the appropriate level for that particular implementation.

Figure 5:
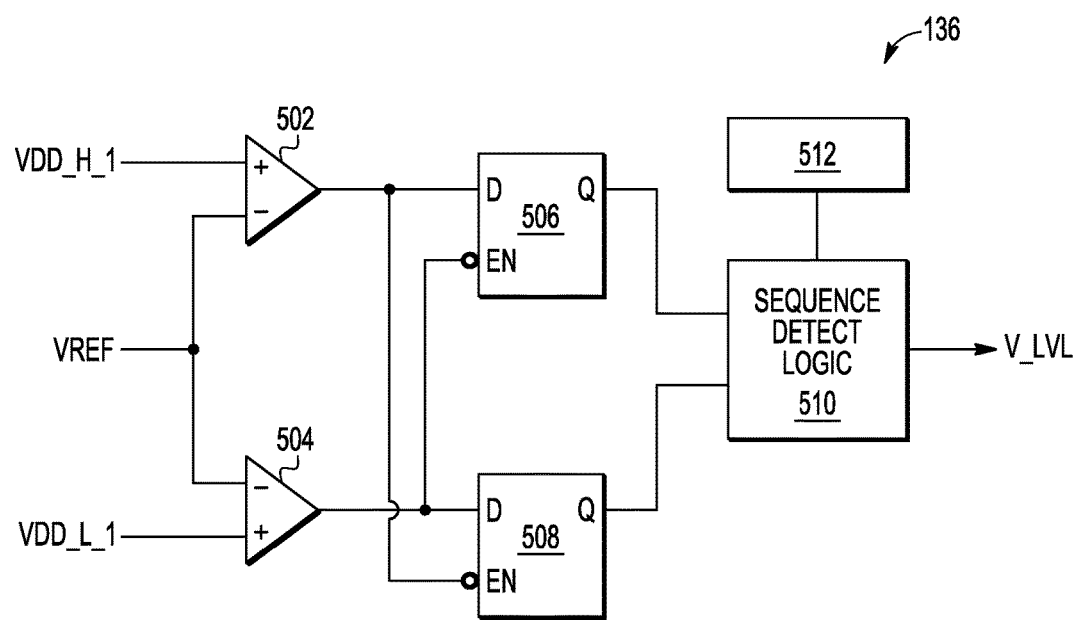
FIG. 5 is a block diagram illustrating an example implementation of the power sequence detector of FIG. 4 in greater detail in accordance with some embodiments.

FIG. 5 illustrates an example implementation of the power sequence detector 136 in accordance with at least one embodiment. The power sequence detector 138 may be implemented in a similar manner. As shown, the power sequence detector 136 includes voltage level sensors 502, 504, latches 506, 508, and sequence detect logic 510. The voltage level sensors 502, 504 may be implemented, using, for example, conventional comparators. The comparator of the voltage level sensor 502 has an input includes an input coupled to the voltage rail 112, an input to receive a voltage reference VREF, and an output connected to an input of the latch 506. The comparator of the voltage level sensor 504 has an input coupled to receive the voltage reference VREF, an input coupled to the voltage rail 111, and an output coupled to an input of the latch 508. The latch 506 further includes an input to receive the output of the comparator of the voltage level sensor 504 and an output coupled to one input of the sequence detect logic 510. Similarly, the latch 508 includes another input to receive the output of the comparator of the voltage level sensor 502 and an output coupled to a second input of the sequence detect logic 510. The sequence detect logic 510 further includes an output to provide the value V_LVL.

Initially the voltage levels of the voltage rails 112, 111 (that is, VDD_H_1 and VDD_L_1) are below the voltage reference VREF and thus the output of the comparators is a logic 0. This causes the latch circuits 506, 508 to be transparent. When the voltage level of one of the voltage rails 111, 112 rises above the voltage reference VREF, the associated voltage level sensor 502, 504 outputs a logic 1 value. This is output to the D input of the transparent latch and simultaneously closes the latch connected to the other voltage level sensor. When the late-arriving voltage rail finally rises above the voltage reference, its voltage level sensor outputs a logic 1 and closes the transparent latch of the earlier arriving voltage rail. Thus, this circuit latches the voltage rail sequence and presents the information to the sequence detect/decode logic (510) to generate "V_LVL"

In some implementations, the electronic device 100 may be subject to warm boots or brown outs due to temporary interruptions in the power supply. In such instances, it may be problematic for the electronic device 100 to ramp up the voltage rails 111, 112 in the manner described above so as to re-program the default voltage level for the IO pad cells 121, 122. Accordingly, to avoid losing the already-determined value for V_LVL, in at least one embodiment the power sequence detector 136 includes a storage element 512 to store the current value of V_LVL. Thus, in the event of a warm boot or brown out, the value of V_LVL can be read out of the storage element 512 and used to configure the output of the sequence detect logic 510, thereby facilitating continuation of the previous configuration of the default voltage level for the IO pad cells 121, 122.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:

monitoring, at an integrated circuit (IC) package of an electronic device, a first voltage rail and a second voltage rail of the electronic device; and configuring a first set of one or more input/output (IO) pad cells of the IC package to operate at one of a non-zero first voltage level or a non-zero second voltage level depending on which of the first voltage rail and the second voltage rail ramps up to its respective specified operational voltage level first;

wherein configuring the first set of one or more IO pad cells comprises:

responsive to the first voltage rail ramping up to the first voltage level before the second voltage rail has ramped up to the second voltage level, configuring the first set of one or more IO pad cells to operate at the first voltage level; and responsive to the second voltage rail ramping up to the second voltage level before the first voltage rail has ramped up to the first voltage level, configuring the first set of one or more IO pad cells to operate at the second voltage level;

wherein the first voltage level is different from the second voltage level.

2. The method of claim 1, further comprising:

configuring the first set of one or more IO pad cells to operate at a select one of the first voltage level and the second voltage level as specified by a configuration register responsive to the first voltage rail ramping up to the first voltage level at the same time that the second voltage rail ramps up to the second voltage level.

3. The method of claim 1, wherein:

monitoring the first voltage rail and the second voltage rail comprises monitoring the first voltage rail and the second voltage rail in response to a power cycling of the electronic device.

4. The method of claim 3, further comprising:

executing a boot process at a processor of the IC package responsive to the power cycling; and reconfiguring the first set of one or more IO pad cells to operate at one of the first voltage level or the second voltage level as part of the boot process.

5. The method of claim 1, further comprising:

subsequent to configuring the first set of one or more IO pad cells, executing a set of executable instructions at a processor of the IC package, the set of executable instructions to manipulate the processor to reconfigure the first set of one or more IO pad cells to operate at the other of the first voltage level or the second voltage level.

6. The method of claim 1, further comprising:

monitoring, at the IC package, a third voltage rail and a fourth voltage rail of the electronic device; and configuring a second set of one or more IO pad cells of the IC package to operate at one of a non-zero third voltage level or a non-zero fourth voltage level depending on which of the third voltage rail and the fourth voltage rail ramps up to its respective specified operational voltage level first.

7. An apparatus comprising:

an integrated circuit (IC) package comprising:

a first voltage rail;

a second voltage rail;

a first set of one or more input/output (IO) pad cells; and a power sequence detector coupled to the first and second voltage rails, the power sequence detector to monitor the first and second voltage rails and configure the first set of one or more IO pad cells to operate at one of a non-zero first voltage level or a non-zero second voltage level depending on which of the first voltage rail and the second voltage rail ramps up to its respective specified operational voltage level first;

wherein the power sequence detector is to:

configure the first set of one or more IO pad cells to operate at the first voltage level responsive to the first voltage rail ramping up to the first voltage level before the second voltage rail has ramped up to the second voltage level; and configure the first set of one or more IO pad cells to operate at the second voltage level responsive to the second voltage rail ramping up to the second voltage level before the first voltage rail has ramped up to the first voltage level;

wherein the first voltage level is different from the second voltage level.

8. The apparatus of claim 7, wherein the power sequence detector further is to:

configure the first set of one or more IO pad cells to operate at the first voltage level responsive to the first voltage rail ramping up to the first voltage level at the same time that the second voltage rail ramps up to the second voltage level, wherein the first voltage level is greater than the second voltage level.

9. The apparatus of claim 7, wherein the power sequence detector comprises:

a first voltage level sensor having an input coupled to the first voltage rail, an input to receive a clock signal, and an output that is asserted when a voltage level on the first voltage rail reaches the first voltage level;

a second voltage level sensor having an input coupled to the second voltage rail, an input to receive the clock signal, and an output that is asserted when a voltage level on the first voltage rail reaches the first voltage level;

a first latch having an input coupled to the output of the first voltage rail, an input to receive the clock signal, and an output;

a second latch having an input coupled to the output of the second voltage rail, an input to receive the clock signal, and an output; and sequence detect logic having an input coupled to the output of the first latch, an input coupled to the output of the second latch, and an output to provide one of a first value or a second value depending on which output of the first and second latches is asserted first, wherein the first value represents the first voltage level and the second value represents the second voltage level.

10. The apparatus of claim 7, wherein:

the power sequence detector is to monitor the first voltage rail and the second voltage rail in response to a power cycling of the IC package.

11. The apparatus of claim 10, wherein the IC package further comprises:

a processor to execute a boot process responsive to the power cycling, wherein the boot process is to manipulate the processor to reconfigure the first set of one or more IO pad cells to operate at one of the first voltage level or the second voltage level.

12. The apparatus of claim 7, wherein the IC package further comprises:

a processor to execute a set of executable instructions subsequent to configuring the first set of one or more IO pad cells, the set of executable instructions to manipulate the processor to reconfigure the first set of one or more IO pad cells to operate at the other of the first voltage level or the second voltage level.

13. The apparatus of claim 7, wherein:
the IC package further comprises a second set of one or more IO pad cells; and
the power sequence detector further is to monitor a third voltage rail and a fourth voltage rail, and to configure the second set of one or more IO pad cells to operate at one of a non-zero third voltage level or a non-zero fourth voltage level depending on which of the third voltage rail and the fourth voltage rail ramps up to its respective specified operational voltage level first.

14. The apparatus of claim 7, further comprising:
a power management component external to the IC package, the power management component to control a timing of a voltage ramp up of the first and second voltage rails to configure a default voltage level for the first set of one or more IO pad cells.

15. The apparatus of claim 14, further comprising:
a storage element coupled to the power management component, the storage element storing timing settings representing the timing of the voltage ramp up of the first and second voltage rails.

16. The apparatus of claim 7, wherein:
the first set of one or more IO pad cells comprises a set of one or more general purpose IO (GPIO) pad cells.

17. A method comprising:
providing an electronic device comprising a power management component powering first and second voltage rails and an integrated circuit (IC) package having a set of one or more input/output (IO) pad cells configurable to be powered by either a non-zero operational first voltage level provided by the first voltage rail or a non-zero operational second voltage level provided by the second voltage rail; and
configuring the set of one or more IO pad cells to be powered by the first voltage level by ramping up the first voltage rail to the first voltage level prior to ramping up the second voltage rail to the second voltage level, wherein the first voltage level is different from the second voltage level.

18. The method of claim 17, wherein:
configuring the set of one or more IO pad cells comprises configuring the set of one or more IO pad cells responsive to a power cycling of the IC package.

* * * * *